(12) United States Patent
Kimura et al.

(10) Patent No.: US 8,115,391 B2
(45) Date of Patent: Feb. 14, 2012

(54) HERMETIC ENVELOPE AND IMAGE DISPLAY APPARATUS USING THE SAME

(75) Inventors: Akihiro Kimura, Yokohama (JP); Masateru Yasuhara, Yokohama (JP); Shigeto Kamata, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 521 days.

(21) Appl. No.: 12/372,287

(22) Filed: Feb. 17, 2009

(65) Prior Publication Data

US 2009/0205849 A1    Aug. 20, 2009

(30) Foreign Application Priority Data

Feb. 19, 2008    (JP) .................................. 2008-037420

(51) Int. Cl.
*H01J 17/16*    (2012.01)
*H01L 33/00*    (2010.01)
(52) U.S. Cl. ......................................... 313/634; 257/99
(58) Field of Classification Search ................. 174/50.5; 313/639; 257/99
See application file for complete search history.

(56) References Cited

U.S. PATENT DOCUMENTS

| | | | |
|---|---|---|---|
| 6,605,893 B2* | 8/2003 | Ando ............................ | 313/495 |
| 6,621,220 B1* | 9/2003 | Hasegawa et al. ............ | 313/634 |
| 7,029,358 B2* | 4/2006 | Ando .............................. | 445/25 |
| 7,214,970 B2* | 5/2007 | Andoh ............................. | 257/99 |
| 7,332,856 B2* | 2/2008 | Kijima et al. .................. | 313/495 |
| 7,972,461 B2* | 7/2011 | Hasegawa et al. ......... | 156/272.8 |
| 2006/0234594 A1 | 10/2006 | Yamada et al. .................. | 445/25 |

FOREIGN PATENT DOCUMENTS

| JP | 2003-203586 | 7/2003 |
|---|---|---|
| JP | 2005-174856 | 6/2005 |

* cited by examiner

*Primary Examiner* — Quyen Leung
*Assistant Examiner* — Thomas Truong
(74) *Attorney, Agent, or Firm* — Fitzpatrick, Cella, Harper & Scinto

(57) ABSTRACT

A hermetic envelope includes a first plate, a second plate, and a frame provided between the first plate and the second plate to form an interior space. A first bonding part is provided between the frame and the first plate to bond the frame and the first plate to each other, and a first abutting part is provided between the frame and the first plate, and positioned closer to the interior space than the first bonding part. A second bonding part is provided between the frame and the second plate to bond the frame and the second plate to each other, and a second abutting part is provided between the frame and the second plate and positioned closer to the interior space than the second bonding part. The second bonding part is positioned closer to the interior space than the first bonding part.

5 Claims, 8 Drawing Sheets

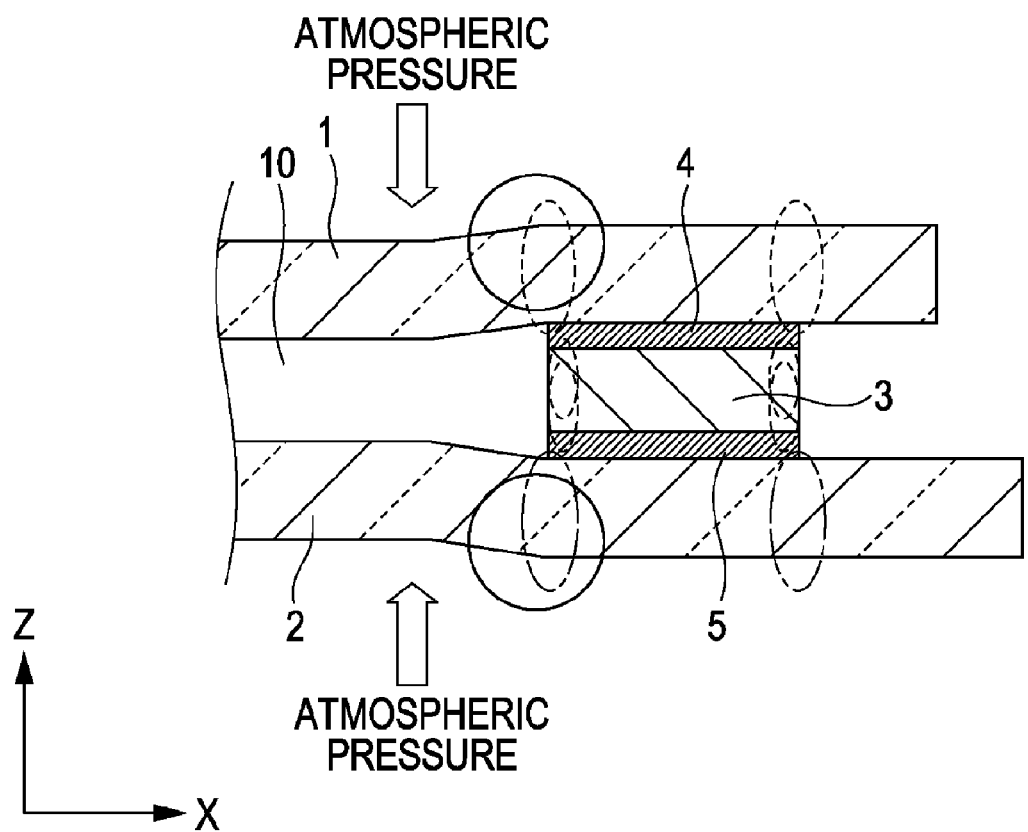

HERMETIC ENVELOPE AND IMAGE DISPLAY APPARATUS USING THE SAME

BACKGROUND OF THE INVENTION

1. Field of the Invention

The present invention relates to a planar hermetic envelope and a planar image display apparatus. More particularly, the present invention relates to a planar image display apparatus in which an electron-emitting device and a light-emitting member are provided in a hermetic envelope whose interior is kept in a vacuous state or a reduced-pressure state.

2. Description of the Related Art

A hermetic envelope used in a field emission display (hereunder referred to as "FED") or a surface-conduction electron-emitter display (hereunder referred to as "SED") has a face plate (a front plate) and a rear plate, which are disposed so as to oppose each other. Peripheral edges of these plates are bonded (seal-bonded) to each other. Since the distance between the face plate the rear plate is kept on the order of mm, this distance cannot be filled with only a seal-bonding member. Therefore, in a seal-bond area between the peripheral edges of these plates, a rectangular frame-shaped side wall (rectangular frame) is disposed. Seal-bonding members are provided between a surface of the side wall (frame) and the face plate and between a surface of the side wall and the rear plate, respectively.

According to Japanese Patent Laid-Open No. 2003-203586, for setting the heights of seal-bonding members, spacers are provided between a frame and a rear plate and between the frame and a face plate, respectively. According to Japanese Patent Laid-Open No. 2005-174856, the width of a bonding part of a face plate and a frame is made different from the width of a bonding part of the frame and a rear plate.

Japanese Patent Laid-Open No. 2003-203586 does not discuss a structure in which a side wall, corresponding to the frame in the present application, abuts upon the face plate and the rear plate. In addition, this document does not discuss a structure in which the position where the side wall is bonded to the face plate is made different from the position where the side wall is bonded to the rear plate. Further, Japanese Patent Laid-Open No. 2005-174856 does not discuss a structure in which a spacer, which is a member corresponding to the frame according to the present application, abuts upon the first plate and the second plate.

FIG. 9 is a schematic sectional view of a vicinity of an edge of a related general hermetic envelope. A frame 3 is disposed between a face plate 1 and a rear plate 2. A first bonding part 4 is provided between the frame 3 and the face plate 1. A second bonding part 5 is provided between the frame 3 and the rear plate 2. The bonding parts 4 and 5 are formed by bonding the plates 1 and 2 to the frame 3 as a result of heating and melting seal-bonding members. Reference numeral 10 denotes a hermetic envelope interior, which is kept in a vacuous state or at a pressure below atmospheric pressure in a plasma display panel or an image display apparatus using an electron-emitting device.

In such a structure, a large residual stress is generated at portions (schematically shown by dotted ellipses in FIG. 9) of the plate 1 and the frame 3 near ends of the bonding part 4 of the face plate 1 and the frame 3. In addition, a large residual stress is generated at portions (schematically shown by alternate-long-and-short-dash-line ellipses in FIG. 9) of the rear plate 2 and the frame 3 near ends of the bonding part 5 of the rear plate 2 and the frame 3.

The residual stress resulting from forming the bonding part 4 by bonding the plate 1 and the frame 3 to each other with the bonding member and the residual stress resulting from forming the bonding part 5 by bonding the plate 2 and the frame 3 to each other with the bonding member overlap each other at the frame 3. Therefore, the resulting total residual stress is large.

The aforementioned residual stresses are noticeable when the bonding parts 4 and 5 are formed by bonding the plates 1 and 2 to the frame 3 as a result of heating and melting the bonding members.

When the hermetic envelope interior 10 is kept in a vacuous state or at a pressure below atmospheric pressure, bending stresses resulting from atmospheric pressure are, respectively, generated at a portion of the face plate 1 and a portion of the rear plate 2 that are, respectively, near an end of the interior-space-10 side of the face plate 1 and an end of the interior-space-10 side of the rear plate 2 (that is, the portions schematically shown by solid circles in FIG. 9).

As shown in FIG. 9, when the positions where the aforementioned residual stresses and the bending stresses are generated overlap each other, the face plate and/or the rear plate tend/tends to break. In addition, the frame 3 also tends to break. As a result, the reliability of the hermetic envelope is reduced.

This problem becomes more serious, for example, when the plates 1 and 2 are made thin or when the frame 3 is made thin (that is, the distance between the plates 1 and 2 is reduced). Such a problem also becomes more serious when the plates 1 and 2 and/or the frame 3 are formed of glass.

Therefore, from the viewpoint of making the hermetic envelope reliable in terms of breaking strength of the hermetic envelope, it is desirable that the stresses be lowered.

SUMMARY OF THE INVENTION

The present invention provides a hermetic envelope comprising a first plate, a second plate, and a frame provided between the first plate and the second plate. The hermetic envelope has an interior space surrounded by the first plate, the second plate, and the frame. A first bonding part is provided between the frame and the first plate to bond the frame and the first plate to each other. A first abutting part which abuts upon the first plate is provided between the frame and the first plate and positioned closer to the interior space than the first bonding part. A second bonding part is provided between the frame and the second plate to bond the frame and the second plate to each other. A second abutting part which abuts upon the second plate is provided between the frame and the second plate and positioned closer to the interior space than the second bonding part. In one aspect, the second bonding part is positioned closer to the interior space than the first bonding part. In another aspect, an inner edge of the first bonding part is offset from an inner edge of the second bonding part.

When the frame 3 abuts upon the plates 1 and 2 at locations closer to the hermetic envelope interior 10 (i.e., an inner edge) than the bonding parts 4 and 5, it is possible to reduce the overlapping of the positions where the aforementioned two types of stresses are generated. As a result, it is possible to reduce concentration of the stresses generated at the face plate 1 and the rear plate 2. In addition, when the positions of the ends of the bonding parts 4 and 5 are made different from each other in a widthwise direction of the frame 3 (that is, a direction perpendicular to a direction in which the plates 1 and 2 face each other), it is possible to reduce the stresses generated at the frame 3 by bonding the face plate 1 and the rear plate 3 to the frame 3 with the bonding members. Therefore, according to the present invention, it is possible to reduce the stresses generated in the hermetic envelope. Further, according to the present invention, the precision of the height near the frame 3 in the hermetic envelope interior 10 (that is, the distance between the face plate 1 and the rear plate 2) can be made higher than that in a related device.

Further features of the present invention will become apparent from the following description of exemplary embodiments with reference to the attached drawings.

BRIEF DESCRIPTION OF THE DRAWINGS

FIG. 9 is an enlarged sectional schematic view of a vicinity of a frame of a related hermetic envelope.

DESCRIPTION OF THE EMBODIMENTS

Embodiments in which a hermetic envelope according to the present invention is applied to an image display apparatus will hereunder be described in detail with reference to the drawings.

The hermetic envelope according to the present invention is applicable to, for example, an electronic component package, a plasma display panel, a field emission display, or a surface-conduction electron-emitter display. In particular, the present invention is desirably applicable to the hermetic envelope used in an image display apparatus using an electron-emitting device such as a field emission type electron-emitting device or a surface-conduction electron-emitting device, from the viewpoint of maintaining the pressure in an interior space of the hermetic envelope below atmospheric pressure.

Figure 1:
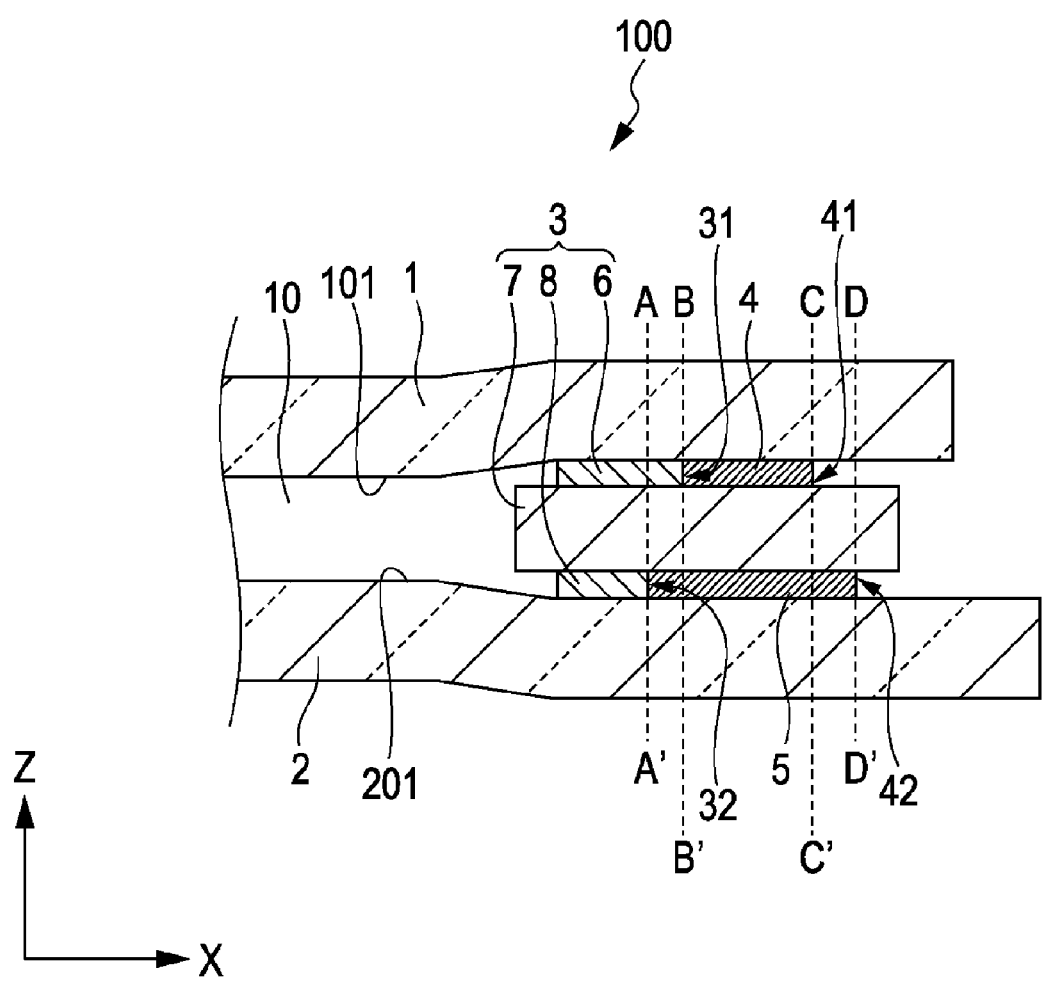
FIG. 1 is an enlarged sectional schematic view of a vicinity of a frame of a hermetic envelope according to an embodiment of the present invention.
Figure 2:
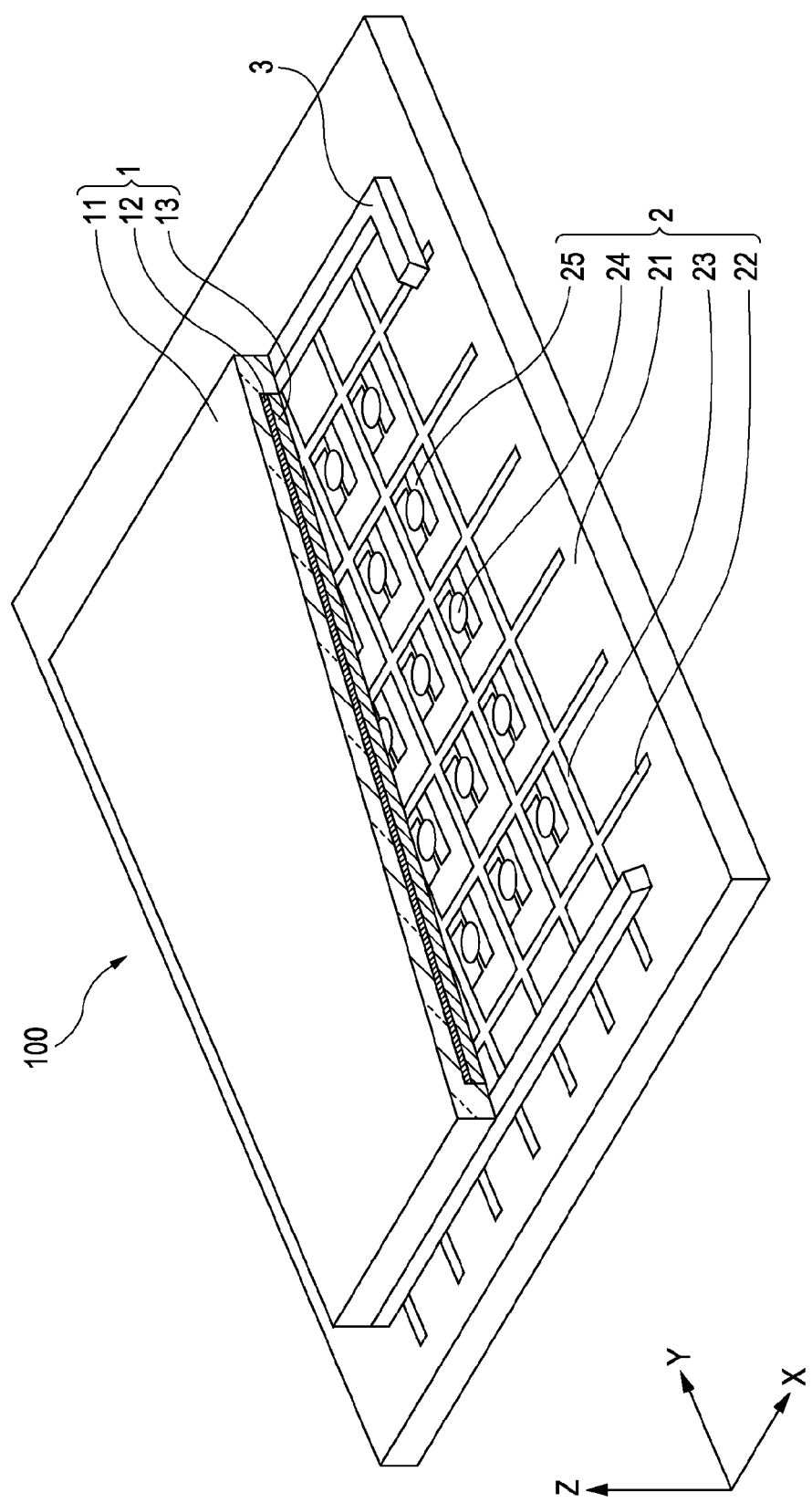
FIG. 2 is a partially broken perspective view of an internal structure of an image display apparatus according to an embodiment of the present invention.

FIG. 1 is a schematic sectional view of an outer area (vicinity of a frame 3) of a hermetic envelope 100 used in an image display apparatus according to an embodiment of the present invention. FIG. 2 is a partially broken perspective view schematically showing an internal structure of the hermetic envelope 100 show in FIG. 1. The image display apparatus can be formed by connecting a related driving circuit to the hermetic envelope 100.

In FIGS. 1 and 2, a frame 3, consisting of a first spacer 6, a second spacer 7, and a third spacer 8, is disposed between a first plate 1 and a second plate 2. More specifically, a principal surface 101 of the first plate 1 and a principal surface 201 of the second plate 2 face each other. The frame 3 is disposed between the principal surface 101 and the principal surface 201. An interior space 10 of the hermetic envelope 100 is surrounded by the first plate 1, the second plate 2, and the frame 3. Although, in the embodiment shown in FIG. 1, the frame 3 is shown as including three members (that is, the first spacer 6, the second spacer 7, and the third spacer 8), the frame 3 may consist of one member.

The first plate 1 (that is, the principal surface 101 of the first plate 1) is bonded to the frame 3 at a first bonding part 4. The second plate (that is, the principal surface 201 of the second plate 2) is bonded to the frame 3 at a second bonding part 5.

Since the first spacer 6, which is a portion of the frame 3, is provided closer to the interior space 10 than the first bonding part 4, the first spacer 6, which is a portion the frame 3, abuts upon the first plate 1 (that is, the principal surface 101 of the first plate 1) at a location that is closer to the interior space 10 than the first bonding part 4.

Since the third spacer 8, which is a portion of the frame 3, is provided closer to the interior space 10 than the second bonding part 5, the third spacer 8, which is a portion of the frame 3, abuts upon the second plate 2 (that is, the principal surface 201 of the second plate 2) at a location that is closer to the interior space 10 than the second bonding part 5.

That is, the portion where the frame 3 abuts upon the first plate 1 is closer to the interior space 10 (inner side) of the hermetic envelope than the portion where the frame 3 is bonded to the first plate 1. In addition, the portion where the frame 3 abuts upon the second plate 2 is closer to the interior space 10 (inner side) of the hermetic envelope than the portion where the frame 3 is bonded to the second plate 2.

Here, the portion where the first spacer 6, which is a portion of the frame 3, abuts upon the first plate 1 (that is, the principal surface 101 of the first plate 1) is a first abutting part. And the portion where the third spacer 8, which is a portion of the frame 3, abuts upon the second plate 2 (that is, the principal surface 201 of the second plate 2) is a second abutting part.

It is the advantage of this structure that the locations where the residual stresses are generated can be shifted from the location where the bending stress is generated. As a result, the stresses that are generated at the first plate and the second plate can be reduced.

Further, in the hermetic envelope 100 according to the present invention, the second bonding part 5 is closer to the interior space 10 than the first bonding part 4. More specifically, an edge 32 of the second bonding part 5 is closer to the interior space 10 than an edge 31 of the first bonding part 4. Here, the edge 32 is the interior-space-10-side (second-abutting-part-side) lateral of the second bonding part 5. The edge 31 is the interior-space-10-side (second-abutting-part-side) lateral of the first bonding part 4. Still more specifically, a normal line A-A', which is normal to the principal surface 201 of the second plate 2 and which passes through the edge 32 is positioned closer to the interior space 10 than a normal line B-B', which is normal to the principal surface 101 of the first plate 1 and which passes through the edge 31. In other words, the normal line B-B' does not overlap with the normal line A-A', and the edge 31 is offset from the edge 32. Practically speaking, the distance between the line A-A' and the line B-B' may be greater than or equal to 0.3 mm, or, desirably, greater than or equal to 0.5 mm. In other words, it is desirable that the second bonding part 5 be positioned closer to the interior space 10 than the first bonding part 4 by a distance greater than or equal to 0.3 mm, or, desirably, greater than or equal to 0.5 mm. The larger the distance between the line A-A' and the line B-B', the better. However, since the vicinity of the hermetic envelope becomes large, practically speaking, the lower limits of the distance between the line A-A' and the line B-B' are the aforementioned values, and the upper limit thereof is less than or equal to 5 mm.

Therefore, the position where the residual stress is generated at the frame 3 by bonding the first plate to the frame 3 does not overlap with, i.e., is offset with the position where the residual stress is generated at the frame 3 by bonding the frame 3 to the second plate. As a result, the stresses generated at the frame 3 can be reduced.

In the embodiment shown in FIG. 1, a normal line D-D', which is normal to the principal surface 201 of the second plate 2 and which passes through an edge 42 at an exterior-space side of the second bonding part 5, is positioned closer to the exterior space than a normal line C-C', which is normal to the principal surface 101 of the first plate 1 and which passes through an edge 41 at the exterior-space side of the first bonding part 4. In other words, the normal line C-C' does not overlap with the normal line D-D', and the edge 41 is offset from the edge 42. In this way, although the stresses of the hermetic envelope 100 can be further reduced when the normal line D-D' passing through the edge 42 does not overlap the normal line C-C', the present invention does not exclude a form in which the normal line C-C' overlaps the normal line D-D'.

Figure 3:
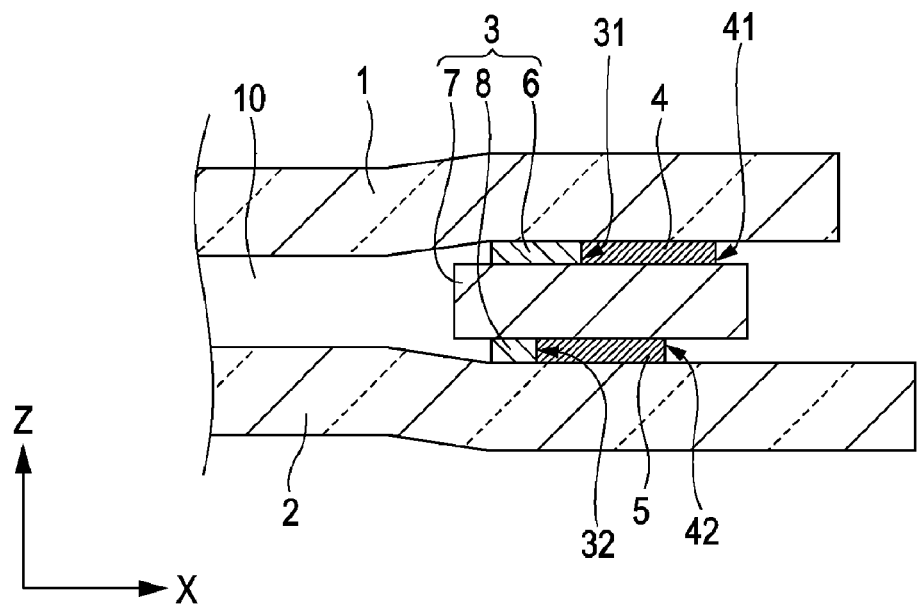
FIG. 3 is an enlarged sectional view of a vicinity of a frame of a hermetic envelope according to another embodiment of the present invention.
Figure 4:
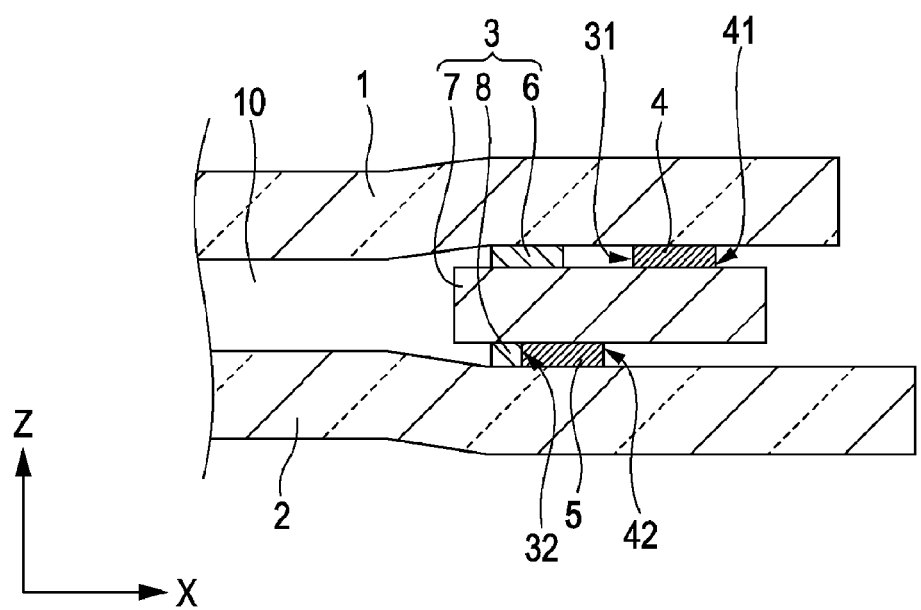
FIG. 4 is an enlarged sectional view of a vicinity of a frame of a hermetic envelope according to still another embodiment of the present invention.

In FIG. 1, the edges 31 and 41 of the first bonding part 4 are disposed inwardly of the respective edges 32 and 42 of the second bonding part 5. However, as shown in FIG. 3, it is possible to provide the edge 32 of the second bonding part 5 closer to the interior space 10 than the edge 31 of the first bonding part 4, and to provide the edge 42 of the second bonding part 5 closer to the interior space 10 than the edge 41 of the first bonding part 1. Alternatively, as shown in FIG. 4, it is possible to position the edges 31 and 41 of the first bonding part 4 outwardly of the edges 32 and 42 of the second bonding part 5.

It is desirable that the relationship of the arrangement described using FIG. 1 be maintained around the entire periphery of the outer area of the hermetic envelope 100.

In the embodiment shown in FIG. 1, the frame 3 consists of three members (that is, the first spacer 6, the second spacer 7, and the third spacer 8). However, the frame 3 may include four or more members, or two or fewer members. When the frame 3 includes a plurality of members, it is not necessary to go through the trouble of processing one member into a complicated cross-sectional shape. However, in this case, one or more steps of bonding the plurality of members are required. Bonding the plurality of members may cause problems related to residual stress. Therefore, whether or not the frame 3 is formed to include one member or a plurality of members is determined as appropriate considering, for example, the cross-sectional shape and size of the frame 3.

In FIG. 1, the first bonding part 4 is connected to or is formed continuously with the first spacer 6, which is a portion of the frame 3, in a direction along the principal surface 101 of the first plate 1. In addition, the second bonding part 5 is connected to or is formed continuously with the third spacer 8, which is a portion of the frame 3, in a direction along the principal surface 201 of the second plate 2.

Figure 5A:
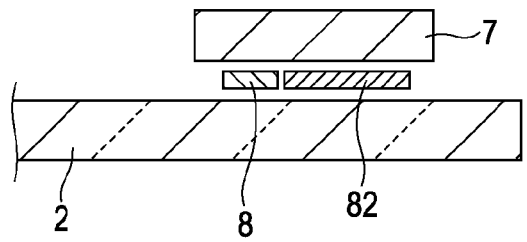
FIGS. 5A to 5D are partial enlarged sectional views of steps of manufacturing a hermetic envelope according to Example 1 of the present invention.
Figure 5B:
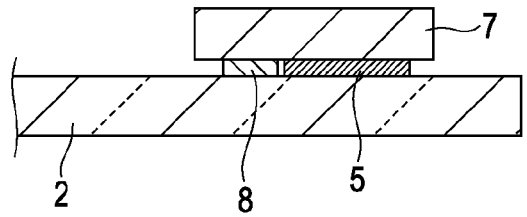
Figure 5C:
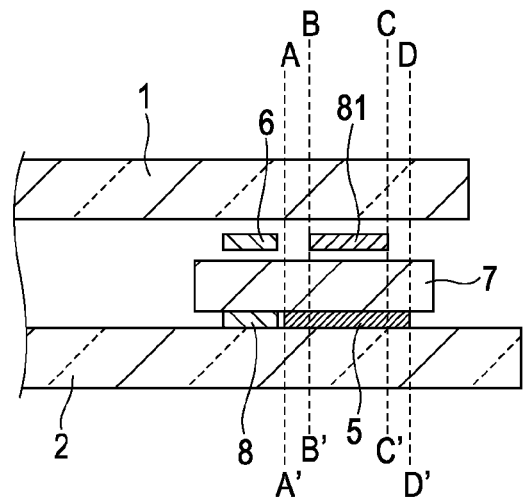
Figure 5D:
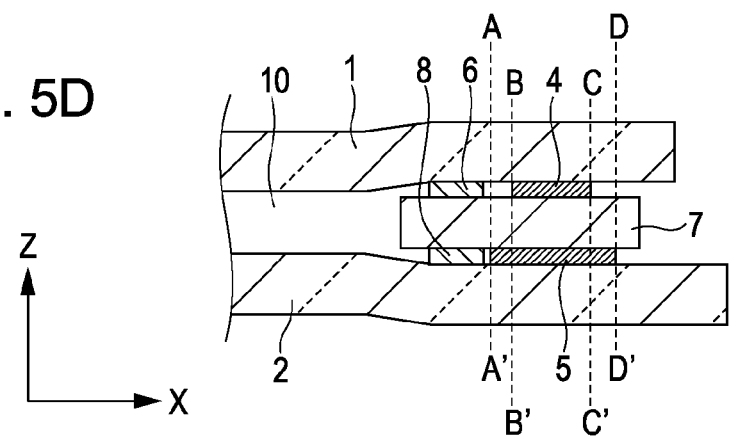
Figure 7A:
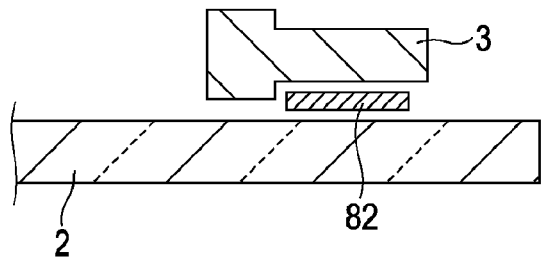
FIGS. 7A to 7D are partial enlarged sectional views of steps of manufacturing a hermetic envelope according to Example 3 of the present invention.
Figure 7B:
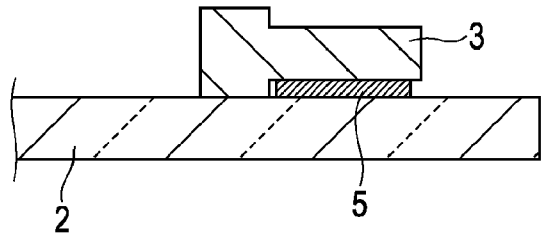
Figure 7C:
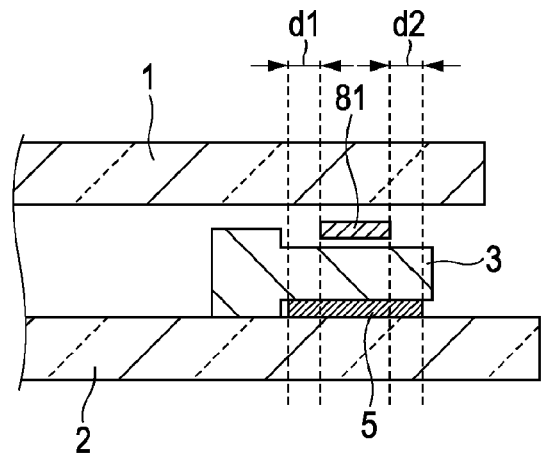
Figure 7D:
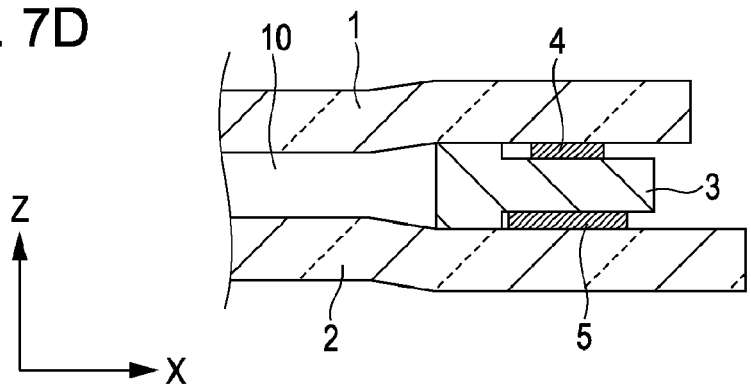

However, it is possible to separate the first bonding part 4 from the first spacer 6, which is a portion of the frame 3, (that is, to separate the first bonding part 4 from the first abutting part) in the direction along the principal surface 101 of the first plate 1 (refer to FIGS. 4, 5D, and 7D). Similarly, it is possible to separate the second bonding part 5 from the third spacer 8, which is a portion of the frame 3, (that is, to separate the second bonding part 5 from the second abutting part) in the direction along the principal surface 201 of the second plate 2 (refer to FIGS. 5D and 7D). When the pressure of the interior space 10 is kept lower than atmospheric pressure, it is desirable that the bonding parts be separated from the abutting part. When the pressure in the space between the bonding parts and the abutting parts is kept lower than atmospheric pressure, it is possible to provide a buffer function for maintaining the pressure of the interior space 10.

It is desirable that the members of the frame 3 be heat resistant to a degree not allowing melting or deformation of the members when the frame 3 is bonded to the first plate 1 and/or the second plate 2. Therefore, it is typically required that glass transition points or melting points of the members of the frame 3 be higher than the bonding temperature of the hermetic envelope 100. The bonding temperature of the hermetic envelope corresponds to the temperature when the first plate 1 and the second plate 2 are bonded to the frame 3 with the respective bonding members.

When the first plate 1 is used as the face plate (front plate) of the image display apparatus, as shown in FIG. 2, the first plate 1 is formed of, for example, a glass plate 11, a light-emitting member 12 (such as a fluorescent member), and an anode 13. The face plate 1 may be called a light-emitting plate. The face plate 1 may be formed by forming the light-emitting member 12 and the anode 13 on the glass plate 11 by, for example, screen printing or a photolithography method. The anode 13 may be what is called a metal-backed anode. For the metal-backed anode, a metallic film, such as an aluminum film, may be used.

When the second plate 2 is used as the rear plate of the image display apparatus, as shown in FIG. 2, the second plate 2 is formed of, for example, a glass plate 21, an electron-emitting device 24, and wires 22 and 23. The rear plate 2 may also be called an electron source plate. The rear plate 2 may be formed by forming the wires 22 and 23 and the electron-emitting device 24 on the glass plate 21 by, for example, screen printing or a photolithography method. As the electron-emitting device, a field emission type electron-emitting device such as an MIM electron-emitting device or a Spindt type electron-emitting device may be used in addition to a surface-conduction electron-emitting device.

The pressure of the interior space 10 is kept lower than atmospheric pressure. When an electron-emitting device is provided in the hermetic envelope 100, the pressure of the interior space 10 is practically kept less than or equal to $10^{-5}$ Pa. The pressure of the exterior space of the hermetic envelope 100 is equal to atmospheric pressure.

Here, although the first plate 1 is used as the face plate and the second plate 2 is used as the rear plate, it is obvious that the first plate may be used as the rear plate and the second plate may be used as the face plate.

The thickness of the first plate 1 and the thickness of the second plate 2 (that is, the thicknesses of the first and second plates 1 and 2 in a Z direction in FIG. 1) are, for example, greater than 0.2 mm and less than 5 mm. Practically speaking, typically, the thicknesses of the first and second plates 1 and 2 are greater than 0.5 mm and less than 2 mm.

In plan view (that is, in an X-Y plane in FIGS. 1 and 2), the frame 3 is a frame-shaped member. The term "frame-shaped" member refers to an annular member, a polygonal member, or a closed-loop member. Typically, the outline of the frame 3 has a quadrilateral shape in plane view. When the outline of the frame 3 is rectangular, the rectangular frame may be formed by, for example, fusing linear members (corresponding to four sides) to each other. Alternatively, the frame 3 may be formed into a rectangular frame by cutting out a rectangular portion in an inner side of a plate member (having a rectangular outline) along the outline.

The thickness (that is, the length in the Z direction in FIG. 1) of the frame 3 is, for example, greater than 0.2 mm and less than 5 mm. Practically speaking, typically, the thickness of the frame 3 is greater than 0.5 mm and less than 2 mm.

The material of the first plate 1, the second plate 2, and the frame 3 of the hermetic envelope according to the present invention is not particularly limited. Using glass makes the present invention more effective.

The first bonding part 4 and the second bonding part 5 are portions where the frame 3 is bonded to the first plate 1 and where the frame 3 is bonded to the second plate 2 by heating and melting bonding members provided between the frame 3 and the first plate 1, and between the frame 3 and the second plate 2. Each bonding member may be a metal (such as aluminum or indium), glass, glass frit, etc. A method of heating the bonding member can be selected as appropriate from the following: electric heating, laser heating, heating in a furnace, etc.

Here, the material of the frame 3 is different from the material of each bonding member. However, in the present invention, the frame 3 may function as the bonding members. For example, when a portion where the frame 3 abuts upon the first plate 1 and/or the second plate 2 is irradiated with, for example, a laser, it is possible to melt an irradiated area and to bond the frame 3 to the first plate 1 and/or to the second plate 2 at the melted portion. In this form, since it is not necessary to separately provide bonding members from the frame member, it is possible to reduce manufacturing costs.

The term "bond" may be replaced by the term "seal-bond." This is because, in the hermetic envelope, the bonding parts have the function of essentially not allowing communication (sealing) between the exterior space and the interior space 10 of the hermetic envelope, in addition to the function of bonding the frame 3 to the first plate 1 or to the second plate 2. Therefore, in the hermetic envelope, "bonding part" may be called "seal-bonding part." Similarly, "bonding member" may be called "seal-bonding member."

EXAMPLES

The present invention will hereunder be described in more detail with reference to specific examples.

Example 1

In the example, an image display apparatus shown in FIG. 2 includes a hermetic envelope in which the cross section of the vicinity of a frame has the form shown in FIG. 5D. A method of producing the hermetic envelope according to the example will hereunder be described.

First, a face plate 1 and a rear plate 2 were provided.

The face plate 1 included a plate 11, formed of glass having a high strain point; a fluorescent member 12, formed on the plate 11 by a printing method; and an anode 13 (metal-backed anode), formed of an Al film having a thickness of approximately 0.1 μm and deposited onto the fluorescent member 12 by vacuum evaporation. The rear plate 2 included a plate 21, formed of glass having a high strain point; a pair of electrodes 25; an electrically conductive film 24, provided between the pair of electrodes 25 and having a gap; a signal line 22; and a scanning line 23. In the example, a surface-conduction electron-emitting device, including the pair of electrodes 25 and the electrically conductive film 24 (provided between the pair of electrodes and having a gap), was used as an electron-emitting device.

In addition, a first spacer 6, a second spacer 7, a third spacer 8, a first seal-bonding member 81, and a second seal-bonding member 82 were provided.

Glass plates having a high strain point and having a width of 3 mm and a thickness of 0.1 mm were provided for four sides, and ends of the glass plates were fused to each other, so that the first spacer 6 and the third spacer 8 were each formed so as to be frame-shaped (closed-loop-shaped). Four glass plates having a high strain point and having a width of 8 mm and a thickness of 0.5 mm were provided, and ends of the plates were fused to each other, so that the second spacer 7 was formed so as to be frame-shaped (closed-loop-shaped). In the example, the term "frame-shaped" or "closed-loop-shaped" refers to the shape shown in FIG. 8A.

Pieces of plate-shaped aluminum each having a width of 3 mm and a thickness of 0.1 mm were provided for four sides, and ends of the pieces of plate-shaped aluminum were fused to each other to provide a seal-bonding member 81 formed of the frame-shaped aluminum. Similarly, pieces of plate-shaped aluminum each having a width of 4 mm and a thickness of 0.1 mm were provided for four sides, and ends of the pieces of plate-shaped aluminum were fused to each other to provide a seal-bonding member 82 formed of the frame-shaped aluminum.

Next, the second seal-bonding member 82 and the third spacer 8 were disposed between the rear plate 2 and the second spacer 7 (see FIG. 5A). The third spacer 8 was disposed so as to be positioned closer to an interior space 10 than the second seal-bonding member 82 and so as to be disposed apart from the second seal-bonding member 82.

By irradiating the second seal-bonding member 82 while performing scanning along the frame with semiconductor laser, the seal-bonding member 82 was melted. Accordingly, the rear plate 2 and the second spacer 7 were bonded to each other to form a second bonding part 5 (FIG. 5B). The second spacer 7 abutted upon the third spacer 8, and the third spacer 8 abutted upon the rear plate 2. The third spacer 8 and the second bonding part 5 were disposed apart from each other.

Next, the first seal-bonding member 81 was disposed between the face plate 1 and the second spacer 7, and the first spacer 6 was disposed between the face plate 1 and the second spacer 7 so as to be situated closer to the interior space 10 than the first seal-bonding member 81. More specifically, the first seal-bonding member 81 is provided as follows. A normal line B-B', normal to a principal surface of the face plate 1 and passing through an edge at the interior-space-10 side of the first seal-bonding member 81, was positioned closer to an exterior space by 0.5 mm than a normal line A-A', normal to a principal surface of the rear plate 2 and passing through an edge at the interior-space-10 side of the second bonding part 5 (FIG. 5C). In addition, a normal line C-C', normal to the principal surface of the face plate 1 and passing through an edge at an exterior space side of the first seal-bonding member 81, was positioned closer to the interior space 10 by 0.5 mm than a normal line D-D', normal to the principal surface of the rear plate 2 and passing through an edge at the exterior-space side of the second bonding part 5.

Next, by irradiating the first seal-bonding member 81 while performing scanning along the frame with semiconductor laser, the first seal-bonding member 81 was melted. Accordingly, the face plate 1 and the second spacer 7 were bonded to each other to form a first bonding part 4 (FIG. 5D).

By the aforementioned bonding operations, the first spacer 6 and the second spacer 8 could be disposed at the interior-space-10 sides of the first bonding part 4 and the second bonding part 5. In addition, the second bonding part 5 could be positioned closer to the interior space 10 than the first bonding part 4.

Next, a vacuum evacuator was connected to an exhaust hole (not shown) provided in the rear plate 2, to exhaust the interior space 10 to $10^{-5}$ Pa. Thereafter, the hermetic envelope 100 in which the interior space 10 was maintained in a vacuous state by sealing the exhaust hole was formed. A related, publicly known driving circuit was connected to the hermetic envelope 100 manufactured as described above, to obtain an image display apparatus.

According to the vacuum evacuator 100 manufactured in the example, it is possible to reduce the amount of stress generated at the face plate 1, the rear plate 2, and the frame 3, so that the vacuum evacuator 100 is made more reliable in terms of breaking strength than a related hermetic envelope. The image display apparatus according to the example has excellent strength with respect to shock.

Example 2

Figure 6A:
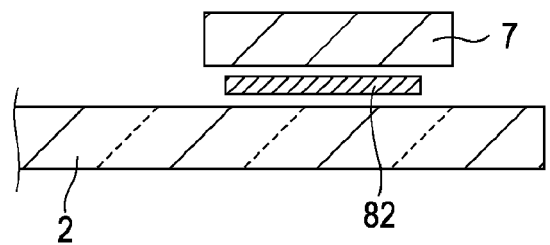
FIGS. 6A to 6D are partial enlarged sectional views of steps of manufacturing a hermetic envelope according to Example 2 of the present invention.
Figure 6B:
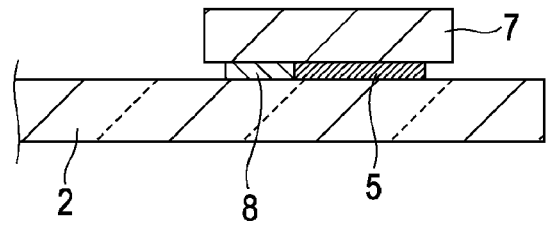
Figure 6C:
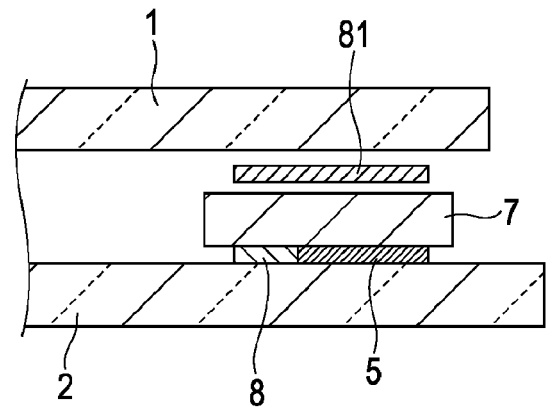
Figure 6D:
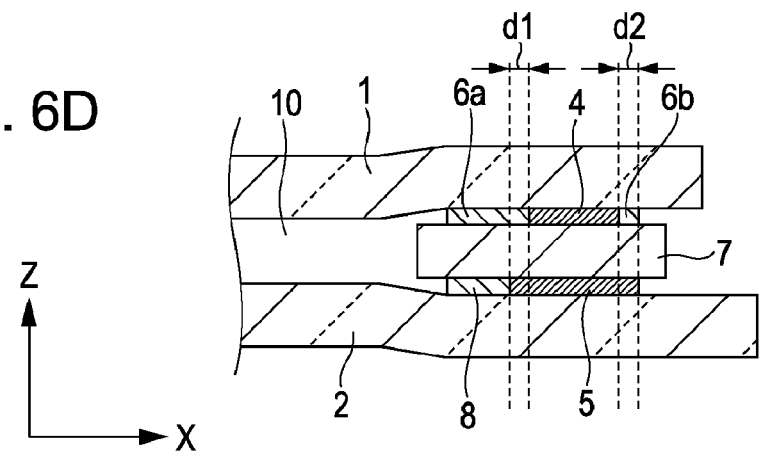

In this example, the image display apparatus shown in FIG. 2 includes a hermetic envelope in which the cross section of a vicinity of a frame has the form shown in FIG. 6D. A method of producing the hermetic envelope according to the example will hereunder be described with reference to FIGS. 6A to 6D. The structure of a face plate 1 and that of a rear plate 2 are similar to those in Example 1. In the example, seal-bonding members (bonding members) and portions of the frame (spacers) are formed using one member.

Figure 8A:
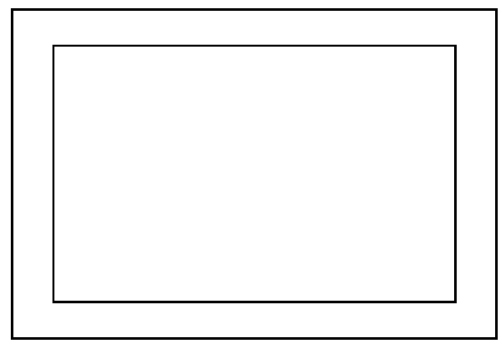
FIGS. 8A to 8C are schematic plans views each illustrating a frame according to the present invention.

Four pieces of plate-shaped aluminum having a width of 7 mm and a thickness of 0.1 mm were provided, and ends of the plates were fused to each other, to form two pieces of frame-shaped aluminum (81, 82), shown in FIG. 8A.

Next, the frame-shaped aluminum 82 was disposed between the rear plate 2 and a second spacer 7, which were provided as in Example 1 (FIG. 6A).

Figure 8B:
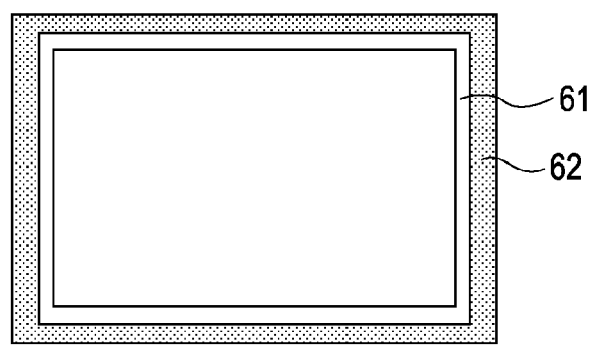

At this time, a portion of the frame-shaped aluminum 82 was irradiated with a semiconductor laser and melted, to bond the second spacer 7 to the rear plate 2. At this time, a region excluding a range of 3 mm from an edge at an interior-space-10 side of the frame-shaped aluminum 82 (that is, a region in a range of 4 mm from an edge at an exterior-space side) was scanned and irradiated with laser light, to melt the outer area of the frame-shaped aluminum 82. FIG. 8B shows an irradiation region 62 and a non-irradiation region 61 of the laser light in the pieces of frame-shaped aluminum as viewed from an X-Y plane. In this way, a second bonding part 5 and a third spacer 8, abutted upon the rear plate 2, were formed simultaneously (FIG. 6B). Obviously, the rear plate 2 and the third spacer 8 were not bonded to each other.

Next, the aforementioned frame-shaped aluminum 81 was disposed between the face plate 1 and the second spacer 7, provided in the same way as in Example 1 (FIG. 6C).

Figure 8C:
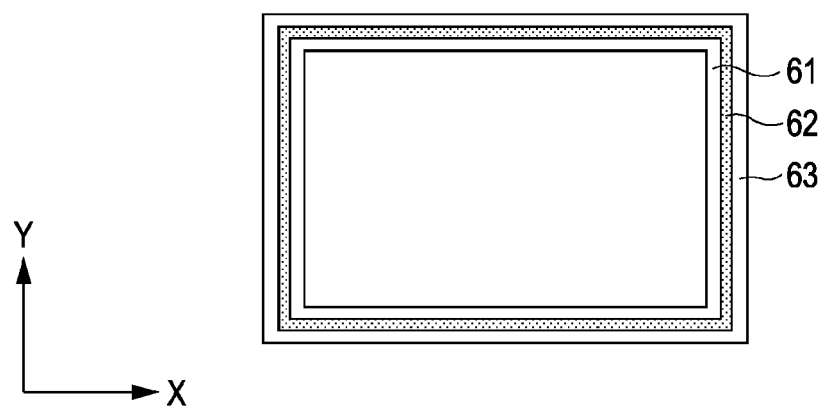

Then, a portion of the frame-shaped aluminum 81 was irradiated with semiconductor laser, and melted, to bond the second spacer 7 to the face plate 1. Thereafter, a region excluding a range within 3.5 mm from an edge at an interior-space-10 side of aluminum 81 and a range within 0.5 mm from an edge of an exterior-space side of aluminum 81 was irradiated with laser light, to melt the central portion of the frame-shaped aluminum 82 into the form of a frame. FIG. 8C shows an irradiation region 62 and non-irradiation regions 61 and 63 of the laser light in the frame-shaped aluminum as viewed from an X-Y plane. The region 61 was the non-irradiation area at the interior-space-10 side, and the region 63 was the non-irradiation area at the exterior-space side. In this way, a first bonding part 4, and a first spacer 6a and a fourth spacer 6b (both of which are abutted upon the face plate 1) were formed simultaneously (FIG. 6D). Obviously, the first spacer 6a and the fourth spacer 6b were not bonded to the face plate 1. That is, by this step, as shown in FIG. 6D, a distance d1 between an edge at an interior-space-10 side of the second bonding part 5 and an edge at an interior-space-10 side of the first bonding part 4, and a distance d2 between an edge at an exterior-space side of the second bonding part 5 and an edge at the exterior-space side of the first bonding part 4 were both 0.5 mm. Dotted lines in FIG. 6D are normal lines, normal to a principal surface of the face plate 1 or to a principal surface of the rear plate 2 and passing through the interior-space-10 side or the exterior-space side of the first bonding part 4 or the second bonding part 5.

Next, as in Example 1, a vacuum evacuator was connected to an exhaust hole (not shown) provided in the rear plate 2, to evacuate the interior space 10. Thereafter, a hermetic envelope, used for an image display apparatus and in which the interior space 10 was maintained in a vacuous state by sealing the exhaust hole, was formed.

The hermetic envelope shown in FIG. 6D and manufactured as described above can be formed so that the face plate 1 abuts upon the first spacer 6a and the rear plate 2 abuts upon the third spacer 8, at the interior-space-10 side of the first bonding part 4 and the interior-space-10 side of the second bonding part 5. The second bonding part 5 can be provided closer to the interior space 10 than the first bonding part 4 by 0.5 mm. As a result, residual stress generated at the face plate 1, the rear plate 2, and the frame can be reduced. The hermetic envelope according to Example 2 can be made more reliable in terms of breaking strength than a related hermetic envelope. Further, since the same material can be used for the bonding parts and the spacers, it is possible to manufacture the hermetic envelope according to Example 2 at a lower cost than the hermetic envelope according to Example 1.

Example 3

In the example, the image display apparatus shown in FIG. 2 includes a hermetic envelope in which a cross section of a vicinity of the frame has the form shown in FIG. 7D. A method of producing the hermetic envelope according to the example will hereunder be described with reference to FIGS. 7A to 7D. The structure of a face plate 1 and that of a rear plate 2 are similar to those in Example 1. In the example, a frame 3 is formed using one member.

Four glass plates having a high strain point and having a width of 8 mm and a thickness of 0.7 mm were provided, and ends of the plates were fused to each other, to provided a frame-shaped glass having a high strain point, shown in FIG. 8A. Next, recesses (having a width of 5 mm and a depth of 0.1 mm) were each formed in a surface of the frame-shaped glass at a face plate 1 side and in a surface of the frame-shaped glass at a rear plate 2 side so as to be situated at an exterior space side. As a result, the frame 3 having a T shape in cross section was formed.

Then, four pieces of plate-shaped aluminum having a width of 3 mm and a thickness of 0.1 mm were provided, and ends of the plates were fused to each other, to form a frame-shaped seal-bonding member 81. In addition, four pieces of plate-shaped aluminum having a width of 4 mm and a thickness of 0.1 mm were provided, and ends of the plates were fused to each other, to form a frame-shaped seal-bonding member 82.

Next, the aluminum 82, serving as the seal-bonding member, was disposed between the recess of the frame 3 and the rear plate 2, provided as in Example 1 (FIG. 7A).

By irradiating the seal-bonding member 82 while performing scanning along an outer area of the frame with semiconductor laser, the seal-bonding member 82 was melted, to bond the rear plate 2 and the frame 3 to each other. In this way, a second bonding part 5 was formed (FIG. 7B).

Next, the aluminum 81, serving as the seal-bonding member, was disposed between the recess of the frame 3 and the face plate 1, provided as in Example 1 (FIG. 7C). At this time, the aluminum 81 was disposed so that a distance d1 between an edge at an interior-space-10 side of the seal-bonding member 81 and an edge at an interior-space-10 side of a second bonding part 5, and a distance d2 between an edge at an exterior-space side of the seal-bonding member 81 and an edge at an exterior-space side of the second bonding part 5 were both 0.5 mm. Dotted lines in FIG. 7C are normal lines, normal to a principal surface of the face plate 1 or to a principal surface of the rear plate 2 and passing through the edge at the interior-space-10 side or the edge at the exterior-space side of the seal-bonding member 81 or the second bonding part 5.

Next, by irradiating the seal-bonding member 81 while performing scanning along the frame 3 with semiconductor laser, the seal-bonding member 81 was melted, to bond the face plate 1 and the frame 3 to each other. As a result, a first bonding part 4 was formed (FIG. 7D).

Next, as in Example 1, a vacuum evacuator was connected to an exhaust hole provided in the rear plate 2, to evacuate the interior space 10. Thereafter, a hermetic envelope, used for an image display apparatus and in which an interior space was maintained in a vacuous state by sealing the exhaust hole was formed.

The hermetic envelope shown in FIG. 7D and manufactured as described above can be formed so that portions of the face plate 1, the rear plate 2, and the frame 3 abut upon the interior-space-10 side of the first bonding part 4 and the interior-space-10 side of the second bonding part 5. The second bonding part 5 can be provided closer to the interior space 10 than the first bonding part 4. As a result, residual stress generated at the face plate 1, the rear plate 2, and the frame can be reduced. The hermetic envelope according to Example 3 can be made more reliable in terms of breaking strength than a related hermetic envelope. Since the frame 3 can be formed using one member, it is possible to user fewer parts than in the hermetic envelope of Example 1, and to increase the precision of the height of the interior space 10 (that is, the distance between the face plate 1 and the rear plate 2).

In Example 3, the frame 3 was T-shaped in cross section, the seal-bonding members (bonding members) are disposed in the recesses of the frame 3, and the frame 3 is seal-bonded (bonded) to the face plate 1 and to the rear plate 2.

However, in the present invention, the frame 3 may function as a bonding member. For example, the frame 3 is abutted upon the first plate and a portion of the frame 3 which abuts upon the plate is irradiated with, for example, a laser. This makes it possible to bond the frame 3 to the first plate by melting the portion of the frame 3 which abuts upon the first plate. And bonding the frame 3 to the second plate could be carried out in a similar manner. Therefore, in this form, it is possible to reduce manufacturing costs.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-037420 filed Feb. 19, 2008, which is hereby incorporated by reference herein in its entirety.

What is claimed is:

1. A hermetic envelope comprising:
   a first plate;
   a second plate;
   a frame provided between the first plate and the second plate,
   wherein the hermetic envelope has an interior space surrounded by the first plate, the second plate, and the frame,
   a first bonding part provided between the frame and the first plate to bond the frame and the first plate to each other;
   a first abutting part which abuts upon the first plate, provided between the frame and the first plate and positioned closer to the interior space than the first bonding part;
   a second bonding part provided between the frame and the second plate to bond the frame and the second plate to each other; and
   a second abutting part which abuts upon the second plate, provided between the frame and the second plate and positioned closer to the interior space than the second bonding part, and
   wherein the second bonding part is positioned closer to the interior space than the first bonding part.

2. The hermetic envelope according to claim 1, wherein the pressure of the interior space is kept lower than atmospheric pressure.

3. The hermetic envelope according to claim 1, wherein the first bonding part is a portion where the first plate and the frame are bonded to each other with a bonding member, and
   wherein the second bonding part is a portion where the second plate and the frame are bonded to each other with a bonding member.

4. The hermetic envelope according to claim 1, wherein the first plate, the second plate, and the frame are formed of glass.

5. An image display apparatus comprising:
   a hermetic envelope comprising:
   a first plate;
   a second plate;
   a frame provided between the first plate and the second plate,
   wherein the hermetic envelope has an interior space surrounded by the first plate, the second plate, and the frame,
   a first bonding part provided between the frame and the first plate to bond the frame and the first plate to each other;
   a first abutting part which abuts upon the first plate, provided between the frame and the first plate and positioned closer to the interior space than the first bonding part;
   a second bonding part provided between the frame and the second plate to bond the frame and the second plate to each other; and
   a second abutting part which abuts upon the second plate, provided between the frame and the second plate and positioned closer to the interior space than the second bonding part, and
   wherein the second bonding part is positioned closer to the interior space than the first bonding part;
   an electron-emitting device; and
   a light-emitting member,
   wherein the electron-emitting device and the light-emitting member are provided in the hermetic envelope.

* * * * *